United States Patent [19]

Fortney et al.

[11] Patent Number: 5,099,210

[45] Date of Patent: Mar. 24, 1992

[54] BATTERY STATUS INDICATOR

[75] Inventors: Neil K. Fortney, Madison; Tom Blandino, Cottage Grove, both of Wis.

[73] Assignee: Koss Corporation, Milwaukee, Wis.

[21] Appl. No.: 531,948

[22] Filed: Jun. 1, 1990

[51] Int. Cl.⁵ .......................................... G01N 27/416
[52] U.S. Cl. ..................... 324/433; 324/435
[58] Field of Search ............... 324/433, 436, 426, 427, 324/435, 133

[56] References Cited

U.S. PATENT DOCUMENTS

| | | | |
|---|---|---|---|
| 3,832,629 | 8/1979 | Cernek, Jr. | 324/436 |
| 4,027,231 | 5/1977 | Lohrmann | 324/133 X |
| 4,318,092 | 3/1982 | Cowles et al. | 324/133 X |
| 4,338,596 | 7/1982 | Huber et al. | 324/436 X |
| 4,376,265 | 3/1983 | Kiuchi et al. | 324/433 X |
| 4,521,735 | 6/1985 | Kageyama | 324/433 |
| 4,536,757 | 8/1985 | Isntema | 324/433 X |
| 4,714,877 | 12/1989 | Kong | 324/133 |
| 4,743,855 | 5/1988 | Randin et al. | 324/430 |
| 4,758,772 | 7/1988 | Lang | 320/48 |
| 4,906,055 | 3/1990 | Horiuchi | 324/433 X |

Primary Examiner—Kenneth A. Wieder
Attorney, Agent, or Firm—Fuller, Ryan & Hohenfeldt

[57] ABSTRACT

A circuit for monitoring and indicating the outut level of an energy source, such as the voltage level of a battery. The circuit includes a triangle wave generator, and a comparison circuit for comparing the triangle wave form to the battery output level and generating a comparison signal. A dual color LED set displays the comparison signal. The diode set is activated in one color when the battery signal is greater than the triangle wave form, while the other color diode is activated when the battery signal is less than the triangle wave form. When the frequency of the triangular wave is two Hertz, the LED set produces discernable flashes between the first color LED and the second color LED when the battery signal is within the peak-to-peak value. The ratio of the times the LEDs are activated is a linear representation of the battery voltage between predetermined "warning" and "discharge" voltages. When the frequency of the triangular wave is thirty Hertz or greater, any flashes produced by the diode set switching between activated LEDs are not discernable by the human eye, resulting in a mixing of colors when the battery signal is within the peak-to-peak value of the triangle wave form.

8 Claims, 1 Drawing Sheet

BATTERY STATUS INDICATOR

BACKGROUND OF THE INVENTION

This invention relates to output level detectors and in particular to devices for sensing and indicating the voltage level of a battery.

Examples of devices for indicating the voltage level or charge/discharge status of a battery abound on the art. Generally they fall into two general types of structures.

The one type is that which is purposely kept simple, generally so much so that any kind of activity of the indicator is kept to a minimum. That is, there is no flashing, color change or other indication to give early warning of low battery charge level. If any is provided at all, it is by sequentially activating a number of discrete indicators such as light emitting diodes. An example of this type is Lohrmann, U.S. Pat. No. 4,027,231. Cowles, et al, U.S. Pat. No. 4,318,092, relies upon a gauge-based indicator. Lang, U.S. Pat. No. 4,758,772 and Huber et al., U.S. Pat. No. 4,338,596, both include oscillators which are activated to cause flashing of indicators only upon the sensing of insufficient voltage in the battery.

The other type provides a much higher level of functionality, and these devices can be so complex as to be more expensive than those in the first category, because they include logic circuits and even microprocessors. Examples of this second type are Kageyama et al, U.S. Pat. No. 4,521,735, which discloses the use of a microprocessor; Ijntema, U.S. Pat. No. 4,536,757, including a number of logic circuits; Kong, U.S. Pat. No. 4,714,877, disclosing a circuit employing over 30 transistors; and Randin et al., U.S. Pat. No. 4,743,855.

What is needed is a simple and inexpensive circuit, the power requirements of which are low, and which gives a linear indication of impending battery discharge. This invention relates to improvements to some of the devices described above and to solutions to some of the problems raised or not solved thereby.

SUMMARY OF THE INVENTION

The invention includes a circuit for monitoring and indicating the output level of an energy source, such as the voltage level of a battery. According to the invention, the circuit includes a circuit for generating a signal having a reference triangle wave form, having a predetermined peak-to-peak value. A circuit is provided for comparing the triangle wave form to a signal related to the battery output level and generating a comparison signal. Two state indicating means, such as a dual color light emitting diode set, are provided for displaying the comparison signal. The diode set is in a first state, that is, has one of the diodes activated, when the comparison signal indicates that the battery voltage signal is greater than the triangle wave form. The diode set is in a second state, that is, having the other diode activated, when the comparison signal indicates that the battery voltage signal is less than the triangle wave form signal. If the triangular wave form has a frequency of two Hertz or less, the LED set produces discernable flashes between the first color LED and the second color LED when the battery voltage 5 is within the peak-to-peak value. If the triangular wave form has a frequency of thirty Hertz or greater, any flashes produced by the diode set switching between activated LEDs is not normally discernable by the human eye, resulting in a mixing of colors when the battery voltage is within the peak-to-peak value of the triangle wave form.

Other objects and advantages of the invention will become apparent hereinafter.

DESCRIPTION OF THE PREFERRED EMBODIMENTS

Figure 1:
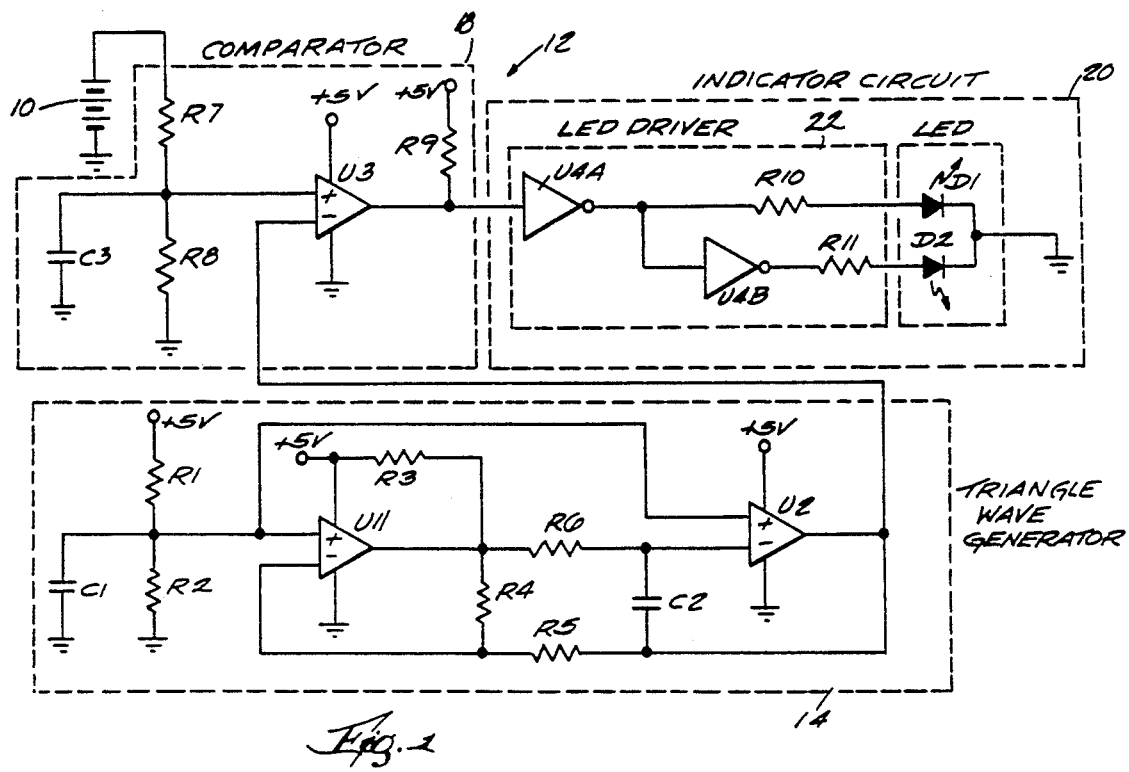
FIG. 1 is a schematic diagram of a circuit constructed according to one embodiment of the invention.
Figure 2:
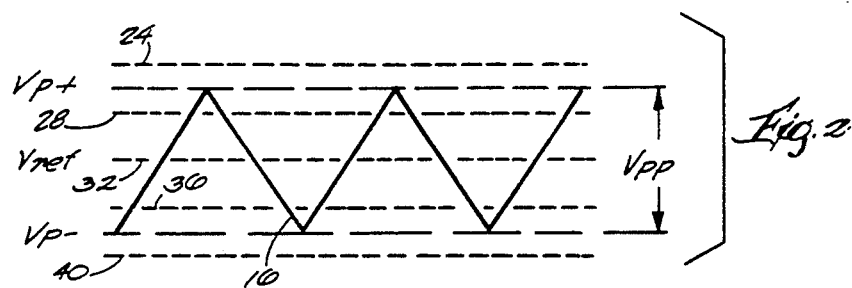
FIG. 2 is a graphical diagram showing a comparison of the triangle wave form generated according to the invention with the possible battery output levels.

Referring now to FIG. 1, there is shown a battery 10 or other energy source, the output level of which is to be tested by the circuit 12 constructed according to a preferred embodiment of the invention. In general, the circuit 12 provides a triangle wave generator 14, which generates a signal having a triangular wave characteristic 16 as shown in FIG. 2. This triangular wave 16 has a predetermined peak-to-peak voltage $V_{pp}$, with the upper peak $V_{p+}$ relating to a predetermined "low battery warning" volta $V_{warn}$ and the lower peak $V_{p-}$ relating to a predetermined "discharged battery" voltage $V_{dis}$. The actual levels of warn and $V_{dis}$ are determined according to the particular voltage and type of battery to be tested, and the related values $V_+$ and $V_-$ by details of the circuit as will be set presently.

The signal from the triangular wave generator 14 is compared with an attenuated portion $V_{batt}$ of the voltage level of the battery 10 by a comparator circuit 18. This comparator circuit 18 generates a comparison signal based upon whether $V_{batt}$ is greater than the level of the triangular wave signal at any particular moment, or vice versa, and generates a comparison signal on that basis. An indication circuit 20 accepts the output of the comparator circuit 18 and produces a visual signal indicating the level of charge of the battery 10. The indication circuit 20 is a two-state indicator, having one state activated when $V_{batt}$ is greater than the triangular wave signal and the other state activated when $V_{batt}$ is less than the triangular wave signal.

In the preferred embodiment, the indication circuit 20 includes two light emitting diodes (LEDs) D1 and D2, of different colors, for example red and green, and driven by an LED driver circuit 22. Then, when $V_{batt}$ is greater than the triangular wave signal, the green LED will be steadily energized, while when the reverse is true the red LED will be steadily energized. Hence, when the actual voltage level of the battery 10 lies between $V_{warn}$ and $V_{dis}$, $V_{batt}$ will lie between $V_{p+}$ and $V_{p-}$, and the red and green LEDs will flash alternately. The frequency of the flashing will depend upon the frequency of the triangular wave signal 16. The proportion of each cycle occupied by each LED, on the other hand, will be dependent upon the proximity of the actual battery voltage level to $V_{warn}$ and to $V_{dis}$.

Figure 3:
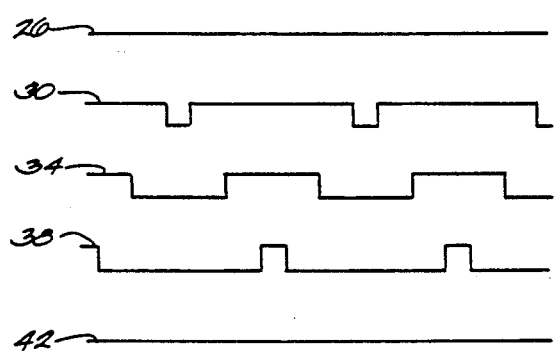
FIG. 3 is a graphical representation of the activation of the indication means according to a preferred embodiment of the invention.

To illustrate this, a number of examples can be seen by comparing FIG. 2 and FIG. 3. As can be seen in these two drawing figures, if $V_{batt}$, the signal from the battery, is greater than the upper peak value $V_{p+}$ of the triangle wave, as shown at 24, only the green LED will be activated, and it will be activated steadily, as shown at 26. If $V_{batt}$ is just less than $V_{p+}$, as shown at 28, the green LED will be activated most of the time, with short flashes of the red LED interspersed, as shown at 30. As the actual battery voltage continues to decline over time, and $V_{batt}$ with it, $V_{batt}$ will reach a point about halfway between $V_{p+}$ and $V_{p-}$, as shown at 32, and the red and green LEDs will split the cycle about evenly, as shown at 34. As $V_{batt}$ continues to decline further over time, it will near $V_{p-}$, as shown at 36, and the red LED will be activated most of the time, with short flashes of the green LED interspersed, as shown at 38. Finally when $V_{batt}$ drops below $V_{p-}$ as shown at 40, the red LED will no longer be deactivated any time during the cycle of the triangular wave, and will remain steadily on, as shown at 42, indicating that the battery requires replacement or recharging. Because the triangular wave form signal is linear within $V_{pp}$, the respective flashing of the red and green LEDs is a linear indication of the battery voltage within this range, and thus a linear indication of the approach of the time to replace or recharge.

The frequency of the triangular wave 16 determines whether the flashing referred to above can be discerned by the human eye. If the frequency is 2 Hz or less, the flashing is readily discernable by the eye of the observer. If on the other hand the frequency of the triangular wave form signal is 30 Hz or greater, the flashing cannot be discerned by the unaided eye. The result in the latter case is a mixing of the two colors of the LEDs, to produce different colors than just red and green. That is, as the actual battery voltage decreases to just less than $V_{warn}$, for instance, the color of the indicator 20 changes from green to yellow-green. As the battery voltage continues to decrease, the color continues to change, first to amber, then to orange, and finally when the battery voltage drops below $V_{dis}$, to red.

The structure of the circuit 12 will now be discussed in detail. Since the particular values of the components may vary according to the particular type and voltage rating of the battery 10 to be tested, the following description of the circuit 12 will employ as an example the testing of a 9-volt "transistor radio type" battery. Different values will be required and encountered for different types of batteries In particular, the triangle wave generator 14 includes a voltage divider comprised of series resistors R1 and R2, connected between a regulated voltage supply, in this case of a level of 5 volts, and ground. These resistors R1 and R2 determine a voltage $V_{ref}$, generally half of the supply voltage, hence in this case 2.5 volts. $V_{ref}$ is supplied to the non-inverting inputs of comparator U1 and integrator U2, being decoupled by a capacitor C1. A resistor R3 is connected between the output of U1 and the voltage supply to pull up the output of U1 to the supply voltage. A resistor R4 is connected between the output of U1 and its inverting input, while a resistor R5 is connected between the output of U2 and the inverting input of U1. The relative values of R4 and R5 determine $V_{pp}$. A resistor R6 is connected between the output of U1 and the inverting input of U2, while a capacitor C2 is connected between the output of U2 and its inverting input. The relative values R6 and C2 determine the frequency of the triangular wave.

The output of U2 is the output of the triangular wave generator 14, and its value follows the characteristic 16 shown in FIG. 2, a triangle wave with amplitude of $V_{pp}$ and centered about $V_{ref}$. As indicated above, the output of the triangular wave generator 14 is connected to the comparator circuit 12. As shown in FIG. 1, the comparator circuit 12 includes a voltage divider formed by two resistors R7 and R8, connected in series between the positive terminal of the battery 10 and ground. These resistors R7 and R8 produce an attenuated voltage $V_{batt}$ for comparison to the triangle wave signal. $V_{batt}$ is always related to the actual battery voltage according to the following relationship:

$$V_{batt} = \text{Actual Battery Voltage} * \frac{R8}{R7 + R8} \quad (1)$$

A capacitor C3 is provided between $V_{batt}$ and ground to decouple $V_{batt}$. $V_{batt}$ is then supplied to the non-inverting input of a comparator U3, while the output of the triangular wave generator 14 is connected to the inverting input, so that the comparator compares the two signals, and outputs a signal on that basis. A resistor R9 pulls the output of the comparator U3 up to the supply voltage. The output of the comparator U3 is then inverted by an inverter U4A and applied to the red diode D1, and the output of inverter U4A is again inverted and applied to the green diode D2, both through current limiting resistors R10 and R11 respectively.

The values of $V_{warn}$ and $V_{dis}$ are chosen based upon the characteristics of the battery to be tested. Referring again to the example of the 9-volt "transistor radio type" battery, these values may be predetermined to be 7.5 volts and 6 volts, respectively. With a supply voltage of a regulated 5 volts, a $V_{ref}$ of 2.5 volts results. Then, to provide a suitable level for $V_{batt}$, the relationship between R7 and R8 must be determined. This is accomplished by calculating the voltage halfway between $V_{warn}$ and $V_{dis}$, and dividing this by $V_{ref}$, resulting in the following equation:

$$\frac{R7}{R8} = \frac{V_{warn} + V_{dis}}{2 * V_{ref}} - 1 \quad (2)$$

Using the values for $V_{warn}$, $V_{dis}$ and $V_{ref}$ set forth just above, this results in a ratio between R7 and R8 of 1.7 to 1. Thus if R7 is selected to be a 1 MegOhm resistor, the value of R8 would be 590 KOhm.

Using these values, a $V_{warn}$ of 7.5 volts gives a $V_{p+}$ of 2.8 volts and a $V_{dis}$ of 6 volts gives a $V_{p-}$ of 2.2 volts for the triangle wave 16. In order for comparator U3 to properly compare the attenuated $V_{batt}$ to the triangle wave 16, and employing the results of Equations (1) and (2), $V_{pp}$, the permissible range of the signal to be compared to $V_{batt}$, is calculated as follows:

$$V_{pp} = (V_{warn} - V_{dis}) * \frac{R8}{R7 + R8} \quad (3)$$

As to the triangle wave generator 14, its $V_{pp}$ is a function of the relation between R5, R4 and the supply voltage, as follows:

$$\frac{R5 * \text{Supply Voltage}}{R4} = V_{pp} \quad (4)$$

Hence, in order that $V_{pp}$ is properly set for comparison to $V_{batt}$ and has the values referred to above, these two equations are combined to arrive at a ratio of the values for R4 and R5 as follows:

$$\frac{R5}{R4} = \frac{V_{warn} - V_{dis}}{\text{Supply Voltage}} * \frac{R8}{R7 + R8} \quad (5)$$

Using this equation and the values set forth just above, the ratio of R4 to R5 is determined to be 9.1 to 1. Thus if R4 is selected as a 1 MegOhm resistor, the value of R5 would be 110KOhm.

Finally, as indicated earlier, the frequency of the triangle wave 16 determines whether the flashing of the diodes D1 and D2, when $V_{batt}$ is between $V_{p+}$ and $V_{p-}$, is discernable as flashing or as a mixing of colors. In order to achieve a predetermined frequency, the following calculation is followed:

$$R6 * C2 = \frac{V_{ref}}{2 * V_{pp} * \text{frequency}} \quad (6)$$

If the desired frequency is 2 Hz, and R6 is selected to be a 1 MegOhm resistor, C2 is calculated to be a 1 uF capacitor. If the desired frequency is to be greater than 30 Hz, on the other hand, and R6 is selected to be a 1 MegOhm resistor, then a 0.068 uF capacitor would be suitable for use as C2.

Hence the invention provides a circuit for the testing and indication of the level of charge of a battery. A signal corresponding to the actual battery voltage is compared to a triangle wave, and an indicator is energized in a first color whenever the signal from the battery is greater than the triangle wave, and in a second color whenever the signal from the battery is less than the triangle wave. Depending upon the frequency of the triangle wave, this continuous comparison results in a flashing of the different colors of the indicator, or a mixing of the colors in a steady manner.

While the apparatus hereinbefore described is effectively adapted to fulfill the aforesaid objects, it is to be understood that the invention is not intended to be limited to the specific preferred embodiment of battery status indicator set forth above. Rather, it is to be taken as including all reasonable equivalents within the scope of the following claims.

We claim:

1. Means for monitoring and indicating the output level of an energy source, comprising:
    means for generating a signal having a triangle wave form having a predetermined peak-to-peak value;
    means for comparing said triangle wave form signal to a signal related to said output level of said energy source and generating a comparison signal therefrom; and
    two-state indicating means for receiving said comparison signal, and being in a first state when said comparison signal indicates that said signal related to the output level of said energy source is greater than said triangle wave form and being in a second state when said comparison signal indicates that said signal related to the output level of said energy source is less than said triangle wave form, resulting in a substantially linear representation of the output level of said energy source caused by said indicating means continually changing state, in a linear manner generally proportional to the proximity of the output level to the upper or lower peaks of said triangle wave form, while said output level is within said peak-to-peak value.

2. Monitoring means as recited in claim 1 wherein said triangle wave form has a frequency of two Hertz or less, such that said two-state indicating means produces discernable flashes between states when the output level of said energy source is within said peak-to-peak value.

3. Monitoring means as recited in claim 1 wherein said triangle wave form has a frequency of thirty Hertz or greater, such that any flashes produced by said two-state indicating means switching between states is not normally discernable.

4. A circuit for monitoring the voltage level of a battery comprising:
    a wave form generating circuit for generating a voltage having a triangular wave form having a predetermined peak-to-peak value;
    a comparator circuit for comparing a signal related to the battery voltage with said triangular wave form voltage; and
    a dual color light emitting diode set, wherein a LED of a first color is activated when said signal related to the battery voltage is greater than said triangular wave form voltage, and wherein a LED of a second color is activated when said signal related to the battery voltage is less than said triangular wave from voltage, resulting in a substantially linear representation of said battery voltage level caused by said light emitting diodes continually being activated alternatively, in a substantially linear manner generally proportional to the proximity of the battery voltage to the upper or lower peaks of said triangle wave form, while said battery voltage level is within said peak-to-peak value of said triangular wave form.

5. A circuit as recited in claim 4 wherein said battery has a predetermined voltage at which it is substantially discharged, and when said battery voltage reaches said substantially discharged voltage, said LED of said second color is substantially continuously activated.

6. A circuit as recited in claim 4 wherein said triangular wave form has a frequency of two Hertz or less, such that said LED set produces discernable flashes between said first color LED and said second color LED when said battery voltage is within said peak-to-peak value.

7. A circuit as recited in claim 4 wherein said triangular wave form has a frequency of thirty Hertz or greater, such that any flashes produced by said LED set switching between activated LEDs is not normally discernable, resulting in a mixing of colors when said battery voltage is within said peak-to-peak value of said triangular wave form.

8. Means for monitoring and indicating the output level of an energy source, comprising:
    means for generating a signal having a triangle wave form having a predetermined peak-to-peak value;
    means for comparing said triangle wave form signal to a signal related to but attenuated from said output level of said energy source and generating a comparison signal therefrom; and
    two-state indicating means for receiving said comparison signal, and being in a first state when said attenuated signal is greater than said triangle wave form and being in a second state when said attenuated signal is less than said triangle wave form, resulting in a substantially linear representation of the output level of said energy source caused by said indicating means continually changing state, in a linear manner, generally proportional to the proximity of the attenuated signal to the upper or lower peaks of said triangle wave form, while said attenuated signal is within said peak-to-peak value.

* * * * *

UNITED STATES PATENT AND TRADEMARK OFFICE
CERTIFICATE OF CORRECTION

PATENT NO. : 5,099,210

DATED : March 24, 1992

INVENTOR(S) : Neil K. Fortney and Tom Blandino

It is certified that error appears in the above—identified patent and that said Letters Patent is hereby corrected as shown below:

Column 6, line 22:
    Delete "from" and substitute --- form ---.

Signed and Sealed this

Twenty-ninth Day of June, 1993

Attest:

MICHAEL K. KIRK

Attesting Officer     Acting Commissioner of Patents and Trademarks